United States Patent
Dubey et al.

(10) Patent No.: US 10,826,492 B2
(45) Date of Patent: Nov. 3, 2020

(54) POWER GATING IN STACKED DIE STRUCTURES

(71) Applicant: Xilinx, Inc., San Jose, CA (US)

(72) Inventors: Prashant Dubey, Uttar Pradesh (IN); Sundeep Ram Gopal Agarwal, Hyderabad (IN)

(73) Assignee: XILINX, INC., San Jose, CA (US)

( * ) Notice: Subject to any disclaimer, the term of this patent is extended or adjusted under 35 U.S.C. 154(b) by 112 days.

(21) Appl. No.: 16/118,899

(22) Filed: Aug. 31, 2018

(65) Prior Publication Data
US 2020/0076424 A1 Mar. 5, 2020

(51) Int. Cl.
*H01L 25/065* (2006.01)
*H03K 17/687* (2006.01)
*H01L 27/06* (2006.01)
*H01L 23/48* (2006.01)
*H01L 23/528* (2006.01)

(52) U.S. Cl.
CPC ....... *H03K 17/6871* (2013.01); *H01L 23/481* (2013.01); *H01L 23/5286* (2013.01); *H01L 25/0657* (2013.01); *H01L 27/0688* (2013.01); *H01L 2225/06541* (2013.01)

(58) Field of Classification Search
CPC ............. H01L 23/5286; H01L 27/0688; H01L 25/0657; H01L 2225/06541; H01L 2225/06527; H01L 23/481; H03K 17/6871
See application file for complete search history.

(56) References Cited

U.S. PATENT DOCUMENTS

| | | | | |
|---|---|---|---|---|
| 8,008,121 B2* | 8/2011 | Choi | ...................... | H01L 24/29 257/127 |
| 8,313,982 B2* | 11/2012 | Dunne | .................. | H01L 21/563 257/621 |
| 8,674,496 B2* | 3/2014 | Lin | ................... | H01L 23/49816 257/690 |
| 8,759,959 B2* | 6/2014 | Yim | ........................ | H01L 25/50 257/686 |
| 8,803,332 B2* | 8/2014 | Lee | ........................ | H01L 21/561 257/686 |
| 8,975,711 B2* | 3/2015 | Otremba | ................. | H01L 24/24 257/401 |
| 9,559,040 B2* | 1/2017 | Batra | ..................... | H01L 23/481 |
| 9,754,923 B1 | 9/2017 | Xie et al. | | |
| 9,768,105 B2* | 9/2017 | Lii | ........................ | H01L 24/20 |

(Continued)

OTHER PUBLICATIONS

U.S. Appl. No. 15/902,703, filed Feb. 22, 2018, Jain, Praful, San Jose, CA USA.

*Primary Examiner* — Savitri Mulpuri
(74) *Attorney, Agent, or Firm* — Patterson + Sheridan, LLP

(57) ABSTRACT

Examples of the present disclosure provide power gating for stacked die structures. In some examples, a stacked die structure comprises a first die and a second die bonded to the first die. In some examples, a power gated power path is from a bonding interface between the dies through TSVs in the second die, a power gating device in the second die, and routing of metallization layers in the second die to the circuit region in the second die. In some examples, a power gated power path comprises a power gating device in a power gating region of the first die and is configured to interrupt a flow of current through the power gated power path to a circuit region in the second die.

13 Claims, 5 Drawing Sheets

(56) References Cited

U.S. PATENT DOCUMENTS

| | | | |
|---|---|---|---|
| 2011/0024890 A1* | 2/2011 | Yang | H01L 21/486 257/686 |
| 2011/0278732 A1* | 11/2011 | Yu | H01L 23/481 257/774 |
| 2015/0348962 A1 | 12/2015 | Chao et al. | |
| 2016/0211241 A1 | 7/2016 | Law et al. | |

\* cited by examiner

POWER GATING IN STACKED DIE STRUCTURES

TECHNICAL FIELD

Examples of the present disclosure generally relate to stacked die structures and, in particular, to power gating in stacked die structures.

BACKGROUND

In the integrated circuit (IC) industry, a technology in which different dies are stacked on each other has been developed. This technology may be generally referred to as stacked die technology or three-dimensional (3D) IC technology. The stacked dies can be interconnected vertically, such as by implementing through-substrate vias (or in some instances, through-silicon vias). By implementing different dies for different portions of the IC, separate dies can be manufactured by different processing, which can help to integrate different processing into forming an IC. Additionally, stacked die structures can have smaller footprints. However, some challenges remain in this still-developing technology.

SUMMARY

Examples of the present disclosure provide power gating for stacked die structures. Generally, stacked die structures as described herein can have a reduced resistance path (e.g., due to reduced length) for the flow of current from a power source. Hence, a voltage drop along the path can be reduced, among other potential benefits.

An example of the present disclosure is an apparatus. The apparatus includes a stacked die structure. The stacked die structure comprises a first die and a second die bonded to the first die. The first die comprises a first semiconductor substrate, first metallization layers on the first semiconductor substrate, first through-substrate vias (TSVs) through the first semiconductor substrate, and a first metal stack through the first metallization layers. The first semiconductor substrate comprises a first circuit region. The second die comprises a second semiconductor substrate comprising a second circuit region. The stacked die structure includes a first power path configured to provide power to the first circuit region. The first power path comprises a first power gating device configured to interrupt a flow of current through the first power path. The first power path is not through a metal line or a metal via of the first metal stack that is in a metallization layer of the first metallization layers that is most distal from the first semiconductor substrate. The stacked die structure further includes a second power path configured to provide power to the second circuit region. The second power path is through the first TSVs and the first metal stack.

Another example of the present disclosure is an apparatus. The apparatus includes a stacked die structure. The stacked die structure comprises a first die and a second die bonded to the first die. The first die comprises a first semiconductor substrate, and the first semiconductor substrate comprises a first power gating region. The second die comprises a second semiconductor substrate, and the second semiconductor substrate comprising a first circuit region. The stacked die structure includes a first power gated power path configured to provide power to the first circuit region. The first power gated power path comprises a first power gating device that is in the first power gating region of the first semiconductor substrate and is configured to interrupt a flow of current through the first power gated power path.

Another example of the present disclosure is an apparatus. The apparatus includes a stacked die structure. The stacked die structure comprises a first die and a second die bonded to the first die. The first die is configured to provide power to the second die at a first bonding interface between the first die and the second die. The second die comprises a first semiconductor substrate comprising a first circuit region and a first power gating region, first metallization layers on the first semiconductor substrate, and, first through-substrate vias (TSVs) through the first semiconductor substrate. A first power gated power path is from the first bonding interface through the first TSVs, a first power gating device of the first power gating region, and first routing of the first metallization layers to the first circuit region.

Another example of the present disclosure is a method of operating an integrated circuit. A power voltage is provided to a first power path in a stacked die structure. The stacked die structure includes a first die bonded to a second die. The first die comprises a first power gating device. The second die comprises a first circuit region electrically connected to the first power path. The first power gating device is controlled to selectively interrupt or not interrupt a flow of current in the first power path to the first circuit region of the second die.

Another example of the present disclosure is a method of operating an integrated circuit. A power voltage is provided to a first power path and a second power path in a stacked die structure. The stacked die structure includes a first die bonded to a second die. The first die comprises a first semiconductor substrate comprising a first circuit region; first metallization layers on the first semiconductor substrate; first through-substrate vias (TSVs) through the first semiconductor substrate; and a metal stack through the first metallization layers. The second die comprises a second semiconductor substrate comprising a second circuit region. The first power path is configured to provide power to the first circuit region and comprises a first power gating device. The first power path is not through a metal line or a metal via of the metal stack in a metallization layer of the first metallization layers that is most distal from the first semiconductor substrate. The second power path is configured to provide power to the second circuit region. The second power path is through the first TSVs and the metal stack. The first power gating device is controlled to selectively interrupt or not interrupt a flow of current in the first power path.

These and other aspects may be understood with reference to the following detailed description.

BRIEF DESCRIPTION OF THE DRAWINGS

So that the manner in which the above-recited features of the present disclosure can be understood in detail, a more particular description of the disclosure, briefly summarized above, may be had by reference to example implementations, some of which are illustrated in the appended drawings. It is to be noted, however, that the appended drawings illustrate only typical example implementations and are therefore not to be considered limiting of its scope, for the disclosure may admit to other equally effective examples.

To facilitate understanding, identical reference numerals have been used, where possible, to designate identical elements that are common to the figures. It is contemplated that elements of one example may be beneficially incorporated in other examples.

DETAILED DESCRIPTION

Figure 1:
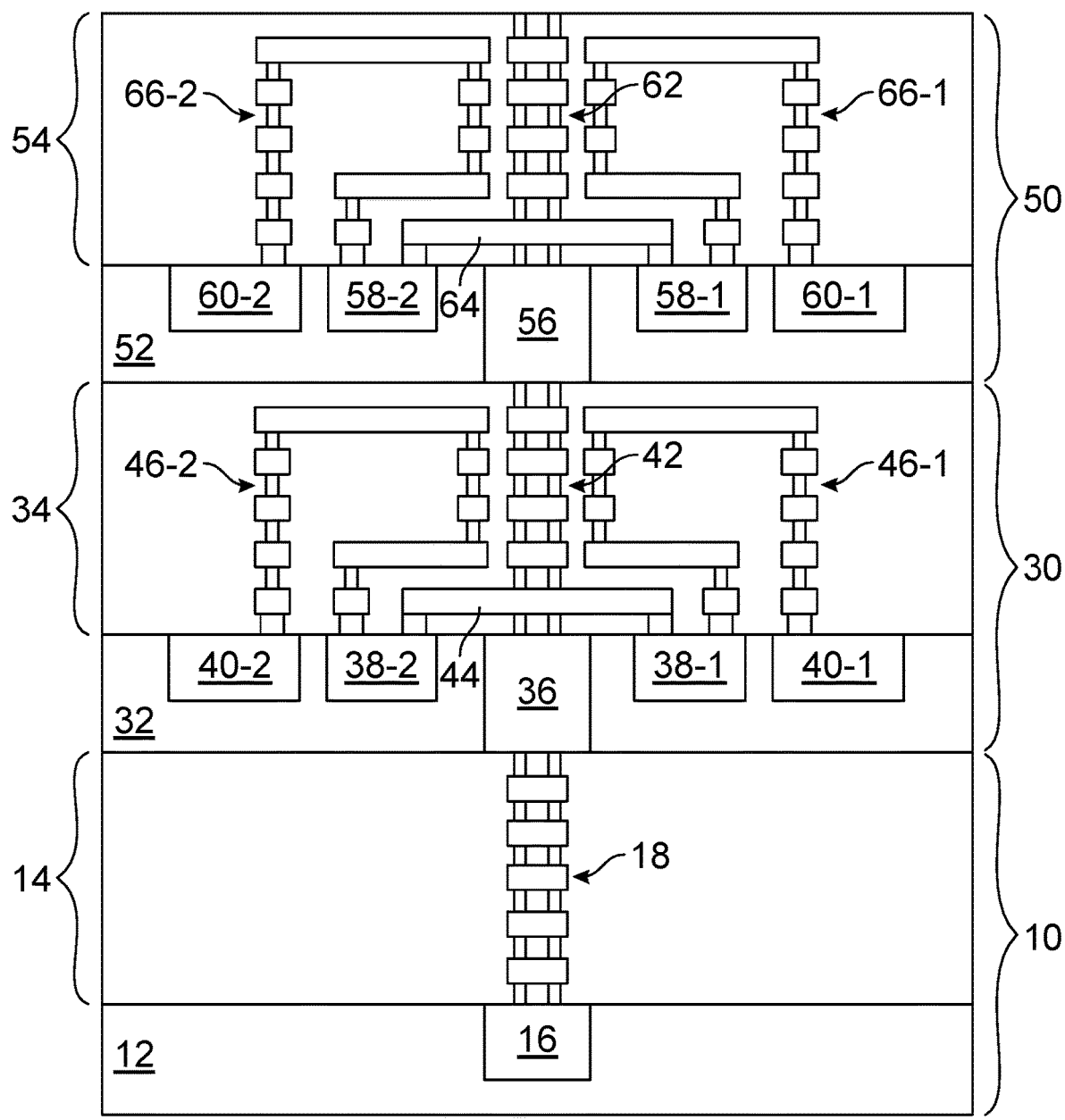
FIG. 1 is a three-dimensional (3D) die stack, in accordance with some examples of the present disclosure.

Examples of the present disclosure provide power gating for stacked die structures. Generally, stacked die structures as described herein can have a reduced resistance path (e.g., due to reduced length) for the flow of current from a power source. Hence, a voltage drop along the path can be reduced. In some examples, an overlying die in a stacked die structure is bonded, in a face-side up orientation, to an underlying die that provides power to the overlying die. The power is provided through one or more through-substrate vias (TSVs) in the overlying die to a power gating device and is then routed to a circuit region in the overlying die. Power can be provided to another overlying die through a metal line and via stack in the overlying die, which metal line and via stack can be electrically connected to TSVs in the other overlying die. In some examples, an overlying die in a stacked die structure is bonded, in a face-side down orientation, to an underlying die that provides power and power gating to the overlying die. The underlying die can have a metal line and via stack, a power gating device, and routing. The power gating device is electrically connected to the metal line and via stack and is further electrically connected to the routing in the underlying die. The overlying die has routing that is connected to the routing of the underlying die, and the routing of the overlying die is electrically connected to a circuit region of the overlying die. The overlying die can further include a metal line and via stack and TSVs that are connected together, and can include a power gating device electrically connected to the metal line and via stack of the overlying die. The power gating device can be further electrically connected to TSVs that may be electrically connected to routing in another overlying die, which routing may further be electrically connected to a circuit region of the other overlying die. In these examples, a voltage drop across the dies may be reduced without significantly impacting an area used to implement TSVs in the dies or may be reduced by implementing fewer TSVs (and hence, a smaller TSV region area). Further, the metal line and via stack and TSVs may be fully utilized. These and other possible advantages will become apparent from the description herein.

Various features are described hereinafter with reference to the figures. It should be noted that the figures may or may not be drawn to scale and that the elements of similar structures or functions are represented by like reference numerals throughout the figures. It should be noted that the figures are only intended to facilitate the description of the features. They are not intended as an exhaustive description of the claimed invention or as a limitation on the scope of the claimed invention. In addition, an illustrated example need not have all the aspects or advantages shown. An aspect or an advantage described in conjunction with a particular example is not necessarily limited to that example and can be practiced in any other examples, even if not so illustrated or if not so explicitly described. Solely for convenience herein, "face-side" of a die corresponds, generally, to a side of the die that has active devices, and respective interconnections therebetween, disposed thereon. As illustrated in examples herein, metallization layers may be formed on the face-side of the die. Further, solely for convenience herein, "back-side" of the die corresponds to a side of the die opposite from the face-side.

FIG. 1 illustrates a three-dimensional (3D) die stack, in accordance with some examples of the present disclosure. The 3D die stack includes a first die 10, a second die 30, and a third die 50. A back-side of the second die 30 is attached (e.g., bonded) to a face-side of the first die 10, and a back-side of the third die 50 is attached (e.g., bonded) to a face-side of the second die 30. The first die 10, as detailed further below, includes power distribution and control circuitry and may also include input/output circuitry. In some examples, the second die 30 and the third die 50 may include one or more subsystems for a field programmable gate array (FPGA), such as a processor system and one or more programmable logic regions, and may, for convenience, be referred to as "fabric" die. In some examples, the third die 50 is a duplicate or redundant die of the second die 30; although in other examples, the third die 50 may be or include a different configuration from the second die 30. The illustration of FIG. 1 and description herein is of features relating to power gating in the 3D die stack. Other features may be included in the first die 10, second die 30, and/or third die 50.

The first die 10 includes a semiconductor substrate 12 (e.g., a silicon substrate) in and/or on which various active devices (e.g., transistors) are disposed. The first die 10 further includes metallization layers 14 on the semiconductor substrate 12. The metallization layers 14 include a number of dielectric layers with respective metal layers disposed therein. The metal layers can include metal lines and/or vias that can connect underlying metal layers or other features to metal lines of the respective metal layer. The metallization layers 14 can include any number of metallization layers, such as 15, 16, and/or 17 metallization layers, where each metallization layer 14 includes a dielectric with metal lines and/or vias disposed therein. The semiconductor substrate 12 has a power management region 16 in which devices are disposed for controlling and/or distributing power in the 3D die stack. A metal line and via stack 18 in the metallization layers 14 extends from the power management region 16 to a face-side surface of the first die 10. The metal line and via stack 18 includes one or more lines and one or more vias in each metallization layer 14 connected together in a vertical stack. In other examples, the metal line and via stack 18 is not aligned vertically.

The second die 30 includes a semiconductor substrate 32 (e.g., a silicon substrate) in and/or on which various active devices are disposed. The second die 30 further includes metallization layers 34 on the semiconductor substrate 32. Similar to the metallization layers 14, the metallization layers 34 include a number of dielectric layers with respective metal layers disposed therein.

A through-substrate via (TSV) region 36 is disposed in the semiconductor substrate 32 and includes a number of TSVs extending from the back-side of the second die 30 (e.g., back-side of the semiconductor substrate 32) through the semiconductor substrate 32. A first power gating region 38-1 and a second power gating region 38-2 are disposed in the semiconductor substrate 32, and each includes devices that, individually and/or collectively, control a distribution of power (e.g., power gating) to one or more other regions of circuits in the second die 30. For example, the devices in the first power gating region 38-1 and the second power gating region 38-2 can be controlled to selectively interrupt a flow of current through the devices. A first circuit region 40-1 and a second circuit region 40-2 are disposed in the semiconductor substrate 32, and each includes devices that, individually or collectively, perform a designed function. For example, the first circuit region 40-1 and the second circuit region 40-2 can each include or be devices for a processing system, a programmable logic region (e.g., fabric logic in a FPGA), an accelerator, memory, or any other circuitry.

A metal line and via stack 42 in the metallization layers 34 extends from the TSV region 36 to a face-side surface of the second die 30. The metal line and via stack 42 includes one or more lines and one or more vias in each metallization layer 34 connected together in a vertical stack. In other examples, the metal line and via stack 42 is not aligned vertically. A metal line 44 extends laterally from the metal line and via stack 42 and is electrically connected to the first power gating region 38-1 (e.g., a source of a power gating device in the first power gating region 38-1) and the second power gating region 38-2 (e.g., a source of a power gating device in the second power gating region 38-2). The metal line 44 is in a lower-most metallization layer (e.g., M0 layer) in the illustrated example. Although not specifically illustrated, an interlayer dielectric may be disposed between the lower-most metallization layer and the semiconductor substrate 32. The interlayer dielectric may have, for example, contacts disposed therein, where the contacts may be formed to source/drains of transistors and/or gates of transistors. As a person having ordinary skill in the art will readily understand, an M0 layer may be formed during what is generally referred to as back-end-of-the-line (BEOL) processing, where an interlayer dielectric with contacts may be formed during what is generally referred to as front-end-of-the-line (FEOL) processing. In other examples, the metal line 44 may be in another lower metallization layer (e.g., M1 layer, M2 layer, etc.) of the metallization layers 34, such as not further from the semiconductor substrate 32 than the sixth lowest metallization layer (e.g., M5 layer).

The metallization layers 34 further include first routing 46-1 and second routing 46-2. The first routing 46-1 includes metal lines and vias in the metallization layers 34 and electrically connects the first power gating region 38-1 (e.g., a drain of the power gating device in the first power gating region 38-1) to the first circuit region 40-1. The first routing 46-1 can include any combination of metal lines and/or vias in any of the metallization layers 34. Similarly, the second routing 46-2 includes metal lines and vias in the metallization layers 34 and electrically connects the second power gating region 38-2 (e.g., a drain of the power gating device in the second power gating region 38-2) to the second circuit region 40-2. The second routing 46-2 can include any combination of metal lines and/or vias in any of the metallization layers 34. For example, each of the first routing 46-1 and second routing 46-2 can include (i) one or more metal line and via stacks, and (ii) a metal line in an upper (e.g., upper-most) metallization layer of the metallization layers 34 that laterally distributes power in, e.g., larger cross-sectional metal line. More specifically, for example, each of the first routing 46-1 and second routing 46-2 can include a first metal line and via stack extending vertically from the first power gating region 38-1 and second power gating region 38-2, respectively, a second metal line and via stack extending vertically from the first circuit region 40-1 and second circuit region 40-2, respectively, and a metal line in an upper metallization layer extending between the first and second metal line and via stacks. Any of the metal line and via stacks (e.g., the first metal line and via stacks) in the first routing 46-1 and second routing 46-2 can be in proximity to, and electrically separable from (e.g., via a power gating device), the metal line and via stack 42.

The third die 50 includes a semiconductor substrate 52 (e.g., a silicon substrate) in and/or on which various active devices are disposed. The third die 50 further includes metallization layers 54 on the semiconductor substrate 52. Similar to the metallization layers 14 and 34, the metallization layers 54 include a number of dielectric layers with respective metal layers disposed therein.

A TSV region 56 is disposed in the semiconductor substrate 52 and includes a number of TSVs extending from the back-side of the third die 50 (e.g., back-side of the semiconductor substrate 52) through the semiconductor substrate 52. A first power gating region 58-1 and a second power gating region 58-2 are disposed in the semiconductor substrate 52, and each includes devices that, individually and/or collectively, control a distribution of power (e.g., power gating) to one or more other regions of circuits in the third die 50. For example, the devices in the first power gating region 58-1 and the second power gating region 58-2 can be controlled to selectively interrupt a flow of current through the devices. A first circuit region 60-1 and a second circuit region 60-2 are disposed in the semiconductor substrate 52, and each includes devices that, individually or collectively, perform a designed function. For example, the first circuit region 60-1 and the second circuit region 60-2 can each include or be devices for a processing system, a programmable logic region (e.g., fabric logic in a FPGA), an accelerator, memory, or any other circuitry.

A metal line and via stack 62 in the metallization layers 54 extends from the TSV region 56 to a face-side surface of the third die 50. The metal line and via stack 62 includes one or more lines and one or more vias in each metallization layer 54 connected together in a vertical stack. In other examples, the metal line and via stack 62 is not aligned vertically. A metal line 64 extends laterally from the metal line and via stack 62 and is electrically connected to the first power gating region 58-1 (e.g., a source of a power gating device in the first power gating region 58-1) and the second power gating region 58-2 (e.g., a source of a power gating device in the second power gating region 58-2). The metal line 64 is in a lower-most metallization layer (e.g., M0 layer) in the illustrated example. In other examples, the metal line 64 may be in another lower metallization layer (e.g., M1 layer, M2 layer, etc.) of the metallization layers 54, such as not further from the semiconductor substrate 52 than the sixth lowest metallization layer (e.g., M5 layer).

The metallization layers 54 further include first routing 66-1 and second routing 66-2. The first routing 66-1 includes metal lines and vias in the metallization layers 54 and electrically connects the first power gating region 58-1 e.g., a drain of the power gating device in the first power gating region 58-1) to the first circuit region 60-1. The first routing 66-1 can include any combination of metal lines and/or vias in any of the metallization layers 54. Similarly, the second routing 66-2 includes metal lines and vias in the metallization layers 54 and electrically connects the second power gating region 58-2 (e.g., a drain of the power gating device in the second power gating region 58-2) to the second circuit region 60-2. The second routing 66-2 can include any combination of metal lines and/or vias in any of the metallization layers 54. For example, the first routing 66-1 and second routing 66-2 can include various metal line and via stacks and metal lines such as described above with respect to the first routing 46-1 and second routing 46-2 of the second die 30.

Although not illustrated, one or more additional dies can be stacked on the third die 50 by attaching (e.g., bonding) a face-side of the underlying die to a back-side of the overlying die. Each additional die may further include TSVs and a metal line and via stack, where a metal line in a lower metal layer extends from the metal line and via stack to connect to a power gating region, similar to illustrated in the second die 30 and the third die 50 in FIG. 1.

In the 3D die stack of FIG. 1, the metal line and via stack 18 of the first die 10, TSVs in the TSV region 36 and the metal line and via stack 42 of the second die 30, and TSVs in the TSV region 56 and the metal line and via stack 62 of the third die 50 are electrically and serially connected together. In some examples, metal features of the metal line and via stack 18 of the first die 10 are metal-to-metal bonded to TSVs in the TSV region 36 of the second die 30 at the bonding interface between the first die 10 and the second die 30, and similarly, metal features of the metal line and via stack 42 of the second die 30 are metal-to-metal bonded to TSVs in the TSV region 56 of the third die 50 at the bonding interface between the second die 30 and the third die 50.

The 3D stacked dies include power paths that are power gated. The power management region 16 provides a power voltage, as described further below. From the power voltage at the power management region 16, a first power gated power path is formed through the metal line and via stack 18 of the first die 10 and through TSVs of the TSV region 36, a lower portion of the metal line and via stack 42, metal line 44, a power gating device in the first power gating region 38-1, and first routing 46-1 of the second die 30 to the first circuit region 40-1 of the second die 30. Similarly, from the power voltage at the power management region 16, a second power gated power path is formed through the metal line and via stack 18 of the first die 10 and through TSVs of the TSV region 36, a lower portion of the metal line and via stack 42, metal line 44, a power gating device in the second power gating region 38-2, and second routing 46-2 of the second die 30 to the second circuit region 40-2 of the second die 30. Neither the first power gated power path nor the second power gated power path is through a metal line or a via of the metal line and via stack 42 that is in an upper-most metallization layer (e.g., most distal from the semiconductor substrate 32) in the metallization layers 34. The first power gated power path and/or the second power gated power path include routing 46-1 and 46-2 between the power gating region 38-1 and 38-2 and the circuit region 40-1 and 40-2, respectively, that may include a metal line and/or a via in an upper-most metallization layer in the metallization layers 34.

Further, from the power voltage at the power management region 16, a third power gated power path is formed through the metal line and via stack 18 of the first die 10; through TSVs of the TSV region 36 and the metal line and via stack 42 of the second die 30; and through TSVs of the TSV region 56, a lower portion of the metal line and via stack 62, metal line 64, a power gating device in the first power gating region 58-1, and first routing 66-1 of the third die 50 to the first circuit region 60-1 of the third die 50. Similarly, from the power voltage at the power management region 16, a fourth power gated power path is formed through the metal line and via stack 18 of the first die 10; through TSVs of the TSV region 36 and the metal line and via stack 42 of the second die 30; and through TSVs of the TSV region 56, a lower portion of the metal line and via stack 62, metal line 64, a power gating device in the second power gating region 58-2, and second routing 66-2 of the third die 50 to the second circuit region 60-2 of the third die 50. Neither the third power gated power path nor the fourth power gated power path is through a metal line or a via of the metal line and via stack 42 that is in an upper-most metallization layer (e.g., most distal from the semiconductor substrate 52) in the metallization layers 54. The third power gated power path and/or the fourth power gated power path include routing 66-1 and 66-2 between the power gating region 58-1 and 58-2 and the circuit region 60-1 and 60-2, respectively, that may include a metal line and/or a via in an upper-most metallization layer in the metallization layers 54.

As is clear from the description of the power gated power paths, different power gated power paths can share various physical components (e.g., TSVs, metal line and via stack, etc.). Further, although not illustrated in FIG. 1, the second die 30 and the third die 50 can include power paths that are not power gated. These non-power gated power paths may also share various physical components of the power gated power paths described above. For example, from the power voltage at the power management region 16, a first non-power gated power path can be formed through the metal line and via stack 18 of the first die 10 and through TSVs of the TSV region 36, the metal line and via stack 42, a metal line in an upper metallization layer of the metallization layers 34, and various routing in the metallization layers 34 of the second die 30 to another circuit region of the second die 30. Similarly, from the power voltage at the power management region 16, a second non-power gated power path can be formed through the metal line and via stack 18 of the first die 10; through TSVs of the TSV region 36 and the metal line and via stack 42 of the second die 30; and through TSVs of the TSV region 56, the metal line and via stack 62, a metal line in an upper metallization layer of the metallization layers 54, and various routing in the metallization layers 54 of the third die 50 to another circuit region of the third die 50.

The description above may not explicitly describe each via in metallization layers that forms part of the respective path and/or each contact to a device in the respective substrate that forms part of the respective path. Such lack of description is for brevity and ease of understanding. A person having ordinary skill in the art will readily understand the presence of such vias and/or contacts.

Figure 2:
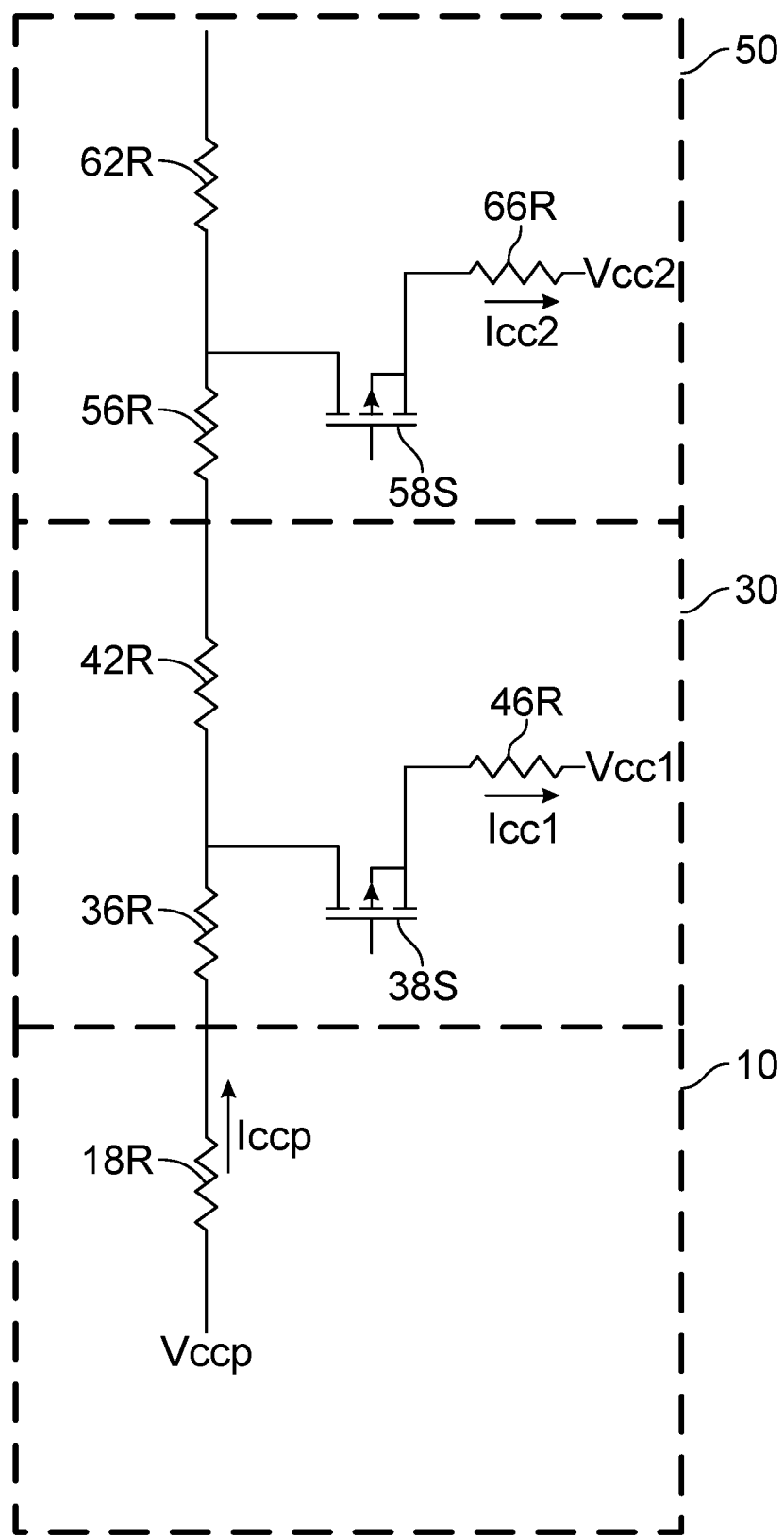
FIG. 2 is a simplified circuit schematic for power distribution and power gating in the 3D die stack of FIG. 1, in accordance with some examples of the present disclosure.

FIG. 2 illustrates a simplified circuit schematic for power distribution and power gating in the 3D die stack of FIG. 1, in accordance with some examples of the present disclosure. A power voltage Vccp is provided by the power management region 16 of the first die 10. A stack resistance 18R is the resistance of the metal line and via stack 18 of the first die 10 and is connected to the power voltage Vccp. The stack resistance 18R is then connected to a TSV resistance 36R, which is the resistance of TSVs of the TSV region 36 of the second die 30 and any portion of the metal line and via stack 42 of the second die 30 between the semiconductor substrate 32 and the metal line 44. The TSV resistance 36R is then connected to a stack resistance 42R and to a power gating switch 38S. The stack resistance 42R is the resistance of the metal line and via stack 42 of the second die 30 from the metal line 44 to the bonding interface with the third die 50. The power gating switch 38S illustrates one or more switches or devices (e.g., one or more power field effect transistors (FETs)) that are capable of interrupting a power flow. The power gating switch 38S is then connected to a routing resistance 46R, which further provides a first device power voltage Vcc1 at a circuit region of the second die 30.

The power gating switch 38S can represent a power gating device in the first power gating region 38-1 and the second power gating region 38-2, and the routing resistance 46R can represent the resistance of the first routing 46-1 and the second routing 46-2. The first power gating region 38-1 and the first routing 46-1 may be in parallel with the second power gating region 38-2 and the second routing 46-2 such that the first power gating region 38-1, second power gating region 38-2, first routing 46-1, and second routing 46-2 may be reduced to the effective power gating switch 38S and the routing resistance 46R for current-voltage analysis. Although a resistance may be created by the metal line 44 in the second die 30 of FIG. 1, such resistance is assumed to be negligible (e.g., due to close proximity of interconnected components) and/or incorporated into other resistances in the illustration of FIG. 2.

The stack resistance 42R is then connected to a TSV resistance 56R, which is the resistance of TSVs of the TSV region 56 of the third die 50 and any portion of the metal line and via stack 62 of the third die 50 between the semiconductor substrate 52 and the metal line 64. The TSV resistance 56R is then connected to a stack resistance 62R and to a power gating switch 58S. The stack resistance 62R is the resistance of the metal line and via stack 62 of the third die 50 from the metal line 64 to the upper-most metallization layer of the metallization layers 54. The power gating switch 58S illustrates one or more switches or devices (e.g., one or more power FETs) that are capable of interrupting a power flow. The power gating switch 58S is then connected to a routing resistance 66R, which further provides a second device power voltage Vcc2 at a circuit region of the third die 50.

The power gating switch 58S can represent a power gating device in the first power gating region 58-1 and the second power gating region 58-2, and the routing resistance 66R can represent the resistance of the first routing 66-1 and the second routing 66-2 similar to what was described previously for the second die 30. Similarly, although a resistance may be created by the metal line 64 in the third die 50 of FIG. 1, such resistance is assumed to be negligible and/or incorporated into other resistances in the illustration of FIG. 2.

Additional dies can be included in the 3D die stack, as stated previously. If one or more additional dies are included in the 3D die stack, and if the die(s) has a same configuration as the second die 30 and/or third die 50, the circuit schematic of those dies can be replicated and appended to the 3D die stack similar to the pattern illustrated by the second die 30 and third die 50 in FIG. 2.

The power voltage Vccp is provided by the power management region 16 of the first die 10. The first device power voltage Vcc1 is the voltage provided at the first circuit region 40-1 and the second circuit region 40-2 of the second die 30 for operating devices therein. Further, a first device current Icc1 is provided (cumulatively) to the first circuit region 40-1 and the second circuit region 40-2 of the second die 30. The second device power voltage Vcc2 is the voltage provided at the first circuit region 60-1 and the second circuit region 60-2 of the third die 50 for operating devices therein. Also, a second device current Icc2 is provided (cumulatively) to the first circuit region 60-1 and the second circuit region 60-2 of the third die 50. For voltage analysis purposes, assume that the first device current Icc1 and the second device current Icc2 are substantially equal, which results in the power current Iccp being substantially two times the first device current Icc1 (or second device current Icc2). Further, assume that resistances in the second die 30 are substantially equal to corresponding resistances in the third die 50 (e.g., the TSV resistances 36R and 56R are substantially equal, the stack resistances 42R and 62R are substantially equal, and the routing resistances 46R and 66R are substantially equal), and that voltage drops across the power gating switches 38S and 58S are substantially equal.

Under the described circumstances, the voltage drop from the power voltage Vccp to the first device power voltage Vcc1 is the voltage drop across the power gating switch 38S plus the first device current Icc1 times the sum of (i) two times the sum of the stack resistance 18R and TSV resistance 36R, and (ii) the routing resistance 46R. E.g., $V_{ccp} - V_{cc1} = V_{38S} + I_{cc1} * [2*(R_{18}+R_{36}) + R_{46}]$. Under the described circumstances, the voltage drop from the power voltage Vccp to the second device power voltage Vcc2 is the voltage drop across the power gating switch 58S plus the second device current Icc2 times the sum of (i) three times TSV resistance 36R, (ii) two times the stack resistance 18R, (iii) the stack resistance 42R, and (iv) the routing resistance 66R. E.g., $V_{ccp} - V_{cc2} = V_{58S} + I_{cc2} * [3*R_{36} + 2*R_{18} + R_{42} + R_{66}] = V_{38S} + I_{cc1} * [3*R_{36} + 2*R_{18} + R_{42} + R_{46}]$.

In the illustrated example, the current flowing through the power gating region and to a circuit region on a respective die enters the die through TSVs of the die and does not flow through the upper portion of the metal and via stack of that die. In some examples, the resistance of the TSVs of a die is less than the resistance of the metal and via stack of that die. Accordingly, in those examples, a voltage drop to the circuit region of the die is reduced by current entering through the TSVs of the die and not flowing fully through the metal and via stack of the die compared to a scenario where current enters through the metal and via stack and does not flow through the TSVs of the die.

Figure 3:
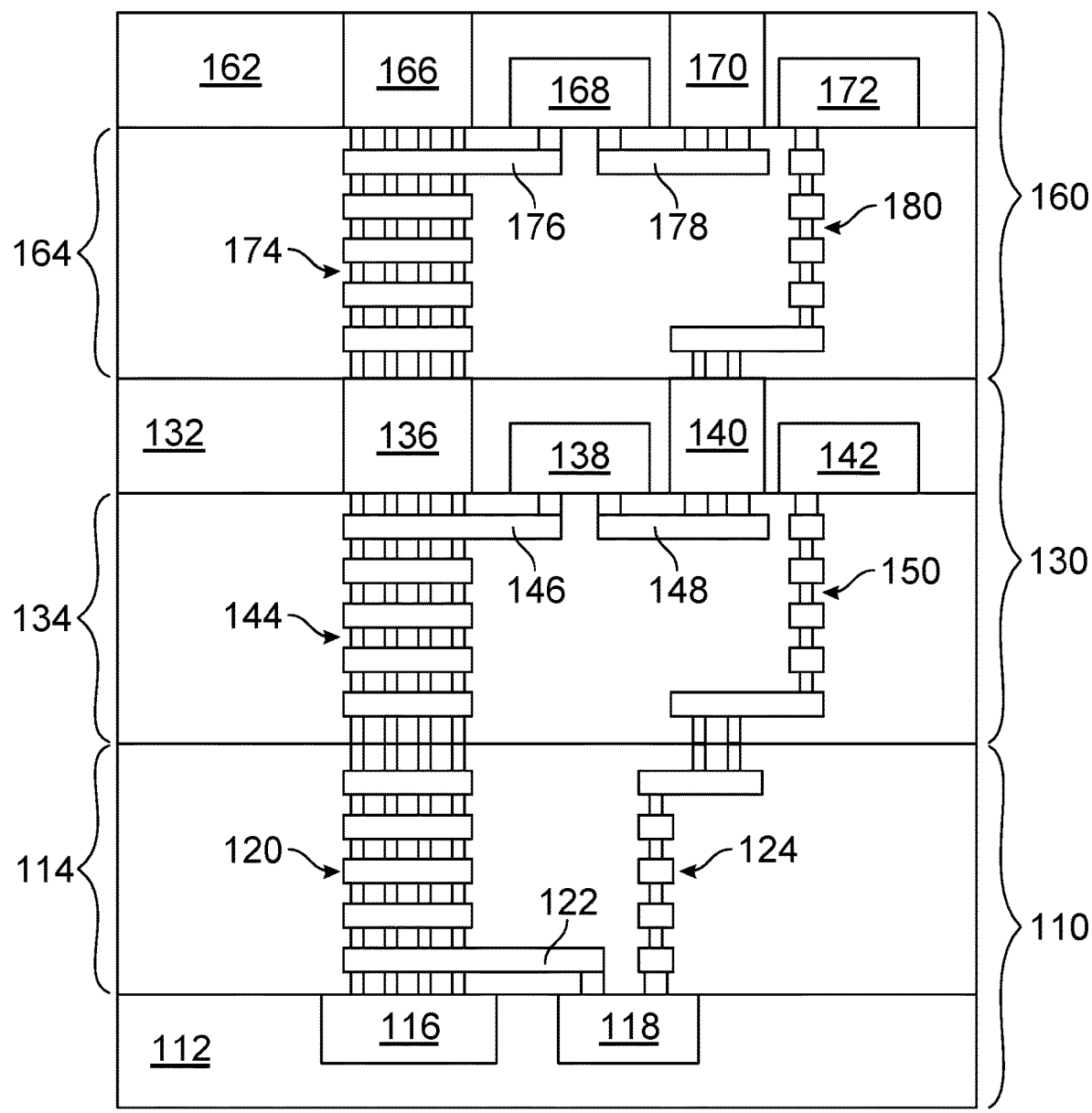
FIG. 3 is another 3D die stack, in accordance with some examples of the present disclosure.

FIG. 3 illustrates a 3D die stack, in accordance with some examples of the present disclosure. The 3D die stack includes a first die 110, a second die 130, and a third die 160. A face-side of the second die 130 is attached (e.g., bonded) to a face-side of the first die 110, and a face-side of the third die 160 is attached (e.g., bonded) to a back-side of the second die 130. The first die 110, as detailed further below, includes power distribution and control circuitry and may also include input/output circuitry. In some examples, the second die 130 and the third die 160 may include one or more subsystems for a FPGA, such as a processor system and one or more programmable logic regions, and may, for convenience, be referred to as "fabric" die. In some examples, the third die 160 is a duplicate or redundant die of the second die 130; although in other examples, the third die 160 may be or include a different configuration from the second die 130. The illustration of FIG. 3 and description herein is of features relating to power gating in the 3D die stack. Other features may be included in the first die 110, second die 130, and/or third die 160.

The first die 110 includes a semiconductor substrate 112 (e.g., a silicon substrate) in and/or on which various active devices are disposed. The first die 110 further includes metallization layers 114 on the semiconductor substrate 112. The metallization layers 114 include a number of dielectric layers with respective metal layers disposed therein, such as described in previous examples. The semiconductor substrate 112 has a power management region 116 in which devices are disposed for controlling and/or distributing power in the 3D die stack. The semiconductor substrate 112 further includes a power gating region 118 that includes devices that, individually and/or collectively, control a distribution of power (e.g., power gating) to one or more regions of circuits in an overlying die (e.g., the second die 130). For example, the devices in the power gating region 118 can be controlled to selectively interrupt a flow of current through the devices.

A metal line and via stack 120 in the metallization layers 114 extends from the power management region 116 to a face-side surface of the first die 110. The metal line and via stack 120 includes one or more lines and one or more vias in each metallization layer 114 connected together in a vertical stack. In other examples, the metal line and via stack 120 is not aligned vertically. A metal line 122 extends laterally from the metal line and via stack 120 and is electrically connected to the power gating region 118 (e.g., a source of a power gating device in the power gating region 118). The metal line 122 is in a lower-most metallization layer (e.g., M0 layer) in the illustrated example. In other examples, the metal line 122 may be in another lower metallization layer (e.g., M1 layer, M2 layer, etc.) of the metallization layers 114. The metallization layers 114 further include routing 124. The routing 124 includes metal lines and vias in the metallization layers 114 and electrically connects to the power gating region 118 (e.g., a drain of the power gating device in the power gating region 118). The routing 124 extends to the face-side surface of the first die 110. The routing 124 can include any combination of metal lines and/or vias in any of the metallization layers 114. For example, the routing 124 can include a metal line and via stack separate from the metal line and via stack 120.

The second die 130 includes a semiconductor substrate 132 (e.g., a silicon substrate) in and/or on which various active devices are disposed. The second die 130 further includes metallization layers 134 on the semiconductor substrate 132. Similar to the metallization layers 114, the metallization layers 134 include a number of dielectric layers with respective metal layers disposed therein.

A TSV region 136 is disposed in the semiconductor substrate 132 and includes a number of TSVs extending from the back-side of the second die 130 (e.g., back-side of the semiconductor substrate 132) through the semiconductor substrate 132. A power gating region 138 is disposed in the semiconductor substrate 132 and includes devices that, individually and/or collectively, control a distribution of power (e.g., power gating) to one or more regions of circuits in an overlying die (e.g., the third die 160). For example, the devices in the power gating region 138 can be controlled to selectively interrupt a flow of current through the devices. A TSV region 140 is disposed in the semiconductor substrate 132 and also includes a number of TSVs extending from the back-side of the second die 130 (e.g., back-side of the semiconductor substrate 132) through the semiconductor substrate 132. A circuit region 142 is disposed in the semiconductor substrate 132 and includes devices that, individually or collectively, perform a designed function. For example, the circuit region 142 can include or be devices for a processing system, a programmable logic region (e.g., fabric logic in a FPGA), an accelerator, memory, or any other circuitry.

A metal line and via stack 144 in the metallization layers 134 extends from the TSV region 136 to a face-side surface of the second die 130. The metal line and via stack 144 includes one or more lines and one or more vias in each metallization layer 134 connected together in a vertical stack. In other examples, the metal line and via stack 144 is not aligned vertically. A metal line 146 extends laterally from the metal line and via stack 144 and is electrically connected to the power gating region 138 (e.g., a source of a power gating device in the power gating region 138). The metal line 146 is in a lower-most metallization layer (e.g., M0 layer) in the illustrated example. In other examples, the metal line 146 may be in another lower metallization layer (e.g., M1 layer, M2 layer, etc.) of the metallization layers 134. A metal line 148 extends laterally and is connected between the power gating region 138 (e.g., a drain of the power gating device in the power gating region 138) and the TSV region 140. The metal line 148 may be in the lower-most metallization layer or another lower metallization layer, and further, may be in the same metallization layer as the metal line 146. The metallization layers 134 further include routing 150. The routing 150 includes metal lines and vias in the metallization layers 134 and extends from the face-side surface of the second die 130 and is electrically connected to the circuit region 142. The routing 150 can include any combination of metal lines and/or vias in any of the metallization layers 134. For example, the routing 150 can include a metal line and via stack separate from the metal line and via stack 144.

The third die 160 includes a semiconductor substrate 162 (e.g., a silicon substrate) in and/or on which various active devices are disposed. The third die 160 further includes metallization layers 164 on the semiconductor substrate 162. Similar to the metallization layers 114 and 134, the metallization layers 164 include a number of dielectric layers with respective metal layers disposed therein.

A TSV region 166 is disposed in the semiconductor substrate 162 and includes a number of TSVs extending from the back-side of the third die 160 (e.g., back-side of the semiconductor substrate 162) through the semiconductor substrate 162. A power gating region 168 is disposed in the semiconductor substrate 162 and includes devices that, individually and/or collectively, control a distribution of power (e.g., power gating) to one or more regions of circuits in any overlying die. For example, the devices in the power gating region 168 can be controlled to selectively interrupt a flow of current through the devices. A TSV region 170 is disposed in the semiconductor substrate 162 and also includes a number of TSVs extending from the back-side of the third die 160 (e.g., back-side of the semiconductor substrate 162) through the semiconductor substrate 162. A circuit region 172 is disposed in the semiconductor substrate 162 and includes devices that, individually or collectively, perform a designed function. For example, the circuit region 172 can include or be devices for a processing system, a programmable logic region (e.g., fabric logic in a FPGA), an accelerator, memory, or any other circuitry.

A metal line and via stack 174 in the metallization layers 164 extends from the TSV region 166 to a face-side surface of the third die 160. The metal line and via stack 174 includes one or more lines and one or more vias in each metallization layer 164 connected together in a vertical stack. In other examples, the metal line and via stack 174 is not aligned vertically. A metal line 176 extends laterally from the metal line and via stack 174 and is electrically connected to the power gating region 168 (e.g., a source of a power gating device in the power gating region 168). The metal line 176 is in a lower-most metallization layer (e.g., M0 layer) in the illustrated example. In other examples, the metal line 176 may be in another lower metallization layer (e.g., M1 layer, M2 layer, etc.) of the metallization layers 164. A metal line 178 extends laterally and is connected between the power gating region 168 (e.g., a drain of the power gating device in the power gating region 168) and the TSV region 170. The metal line 178 may be in the lower-most metallization layer or another lower metallization layer, and further, may be in the same metallization layer as the metal line 176. The metallization layers 164 further include routing 180. The routing 180 includes metal lines and vias in the metallization layers 164 and extends from the face-side surface of the third die 160 and is electrically connected to the circuit region 172. The routing 180 can include any combination of metal lines and/or vias in any of the metallization layers 164. For example, the routing 180 can include a metal line and via stack separate from the metal line and via stack 174.

Although not illustrated, one or more additional dies can be stacked on the third die 160 by attaching (e.g., bonding) a back-side of the underlying die to a face-side of the overlying die. Each additional die may further include TSVs, a metal line and via stack, and interconnecting metal lines, where a metal line in a lower metal layer extends from the metal line and via stack to connect to a power gating region, which is further connected to TSVs by another metal line, similar to illustrated in the second die 130 and the third die 160 in FIG. 3.

In the 3D die stack of FIG. 3, the metal line and via stack 120 of the first die 110, the metal line and via stack 144 and TSVs in the TSV region 136 of the second die 130, and the metal line and via stack 174 and TSVs in the TSV region 166 of the third die 160 are electrically and serially connected together. In some examples, metal features of the metal line and via stack 120 of the first die 110 are metal-to-metal bonded to metal features of the metal line and via stack 144 of the second die 130 at the bonding interface between the first die 110 and the second die 130, and TSVs in the TSV region 136 of the second die 130 are metal-to-metal bonded to metal features of the metal line and via stack 174 of the third die 160 at the bonding interface between the second die 130 and the third die 160.

Additionally, metal features of the routing 124 of the first die 110 are metal-to-metal bonded to metal features of the routing 150 of the second die 130 at the bonding interface between the first die 110 and the second die 130, and TSVs in the TSV region 140 of the second die 130 are metal-to-metal bonded to metal features of the routing 180 of the third die 160 at the bonding interface between the second die 130 and the third die 160. Accordingly, the power gating region 118 of the first die 110 is connected to and is configured to control power distribution to the circuit region 142 of the second die 130, and the power gating region 138 of the second die 130 is connected to and is configured to control power distribution to the circuit region 172 of the third die 160.

More specifically, the 3D stacked dies include power paths that are power gated. The power management region 116 provides a power voltage, as described further below. From the power voltage at the power management region 116, a first power gated power path is formed through a lower portion of the metal line and via stack 120, metal line 122, a power gating device in the power gating region 118, and routing 124 of the first die 110 and through routing 150 of the second die 130 to the circuit region 142 of the second die 130. The first power gated power path is not through the metal line and via stack 144 (e.g., is not through a metal line or a via of the metal line and via stack 144 that is in an upper-most metallization layer (e.g., most distal from the semiconductor substrate 132) of the metallization layers 134). Further, from the power voltage at the power management region 116, a second power gated power path is formed through the metal line and via stack 120 of the first die 110; through the metal line and via stack 144, metal line 146, a power gating device in the power gating region 138, metal line 148, and TSVs of the TSV region 140 of the second die 130; and through routing 180 of the third die 160 to the circuit region 172 of the third die 160. The second power gated power path is not through the metal line and via stack 174 (e.g., is not through a metal line or a via of the metal line and via stack 174 that is in an upper-most metallization layer (e.g., most distal from the semiconductor substrate 162) of the metallization layers 164). Even further, from the power voltage at the power management region 116, a third power gated power path may be formed through the metal line and via stack 120 of the first die 110; through the metal line and via stack 144 and TSVs of the TSV region 136 of the second die 130; and through the metal line and via stack 174, metal line 176, a power gating device in the power gating region 168, metal line 178, and TSVs of the TSV region 170 of the third die 160; and through routing of an overlying die to a circuit region of the overlying die.

As is clear from the description of the power gated power paths, different power gated power paths can share various physical components (e.g., TSVs, metal line and via stack, etc.). Further, although not illustrated in FIG. 3, the second die 130 and the third die 160 can include power paths that are not power gated. These non-power gated power paths may also share various physical components of the power gated power paths described above. For example, from the power voltage at the power management region 116, a first non-power gated power path can be formed through the metal line and via stack 120 of the first die 110 and through an upper portion of the metal line and via stack 144, a metal line in an upper metallization layer of the metallization layers 134, and various routing in the metallization layers 134 of the second die 130 to another circuit region of the second die 130. Similarly, from the power voltage at the power management region 116, a second non-power gated power path can be formed through the metal line and via stack 120 of the first die 110; through the metal line and via stack 144 and TSVs of the TSV region 136 of the second die 130; and through an upper portion of the metal line and via stack 174, a metal line in an upper metallization layer of the metallization layers 164, and various routing in the metallization layers 164 of the third die 160 to another circuit region of the third die 160.

The description above may not explicitly describe each via in metallization layers that forms part of the respective path and/or each contact to a device in the respective substrate that forms part of the respective path. Such lack of description is for brevity and ease of understanding. A person having ordinary skill in the art will readily understand the presence of such vias and/or contacts.

Figure 4:
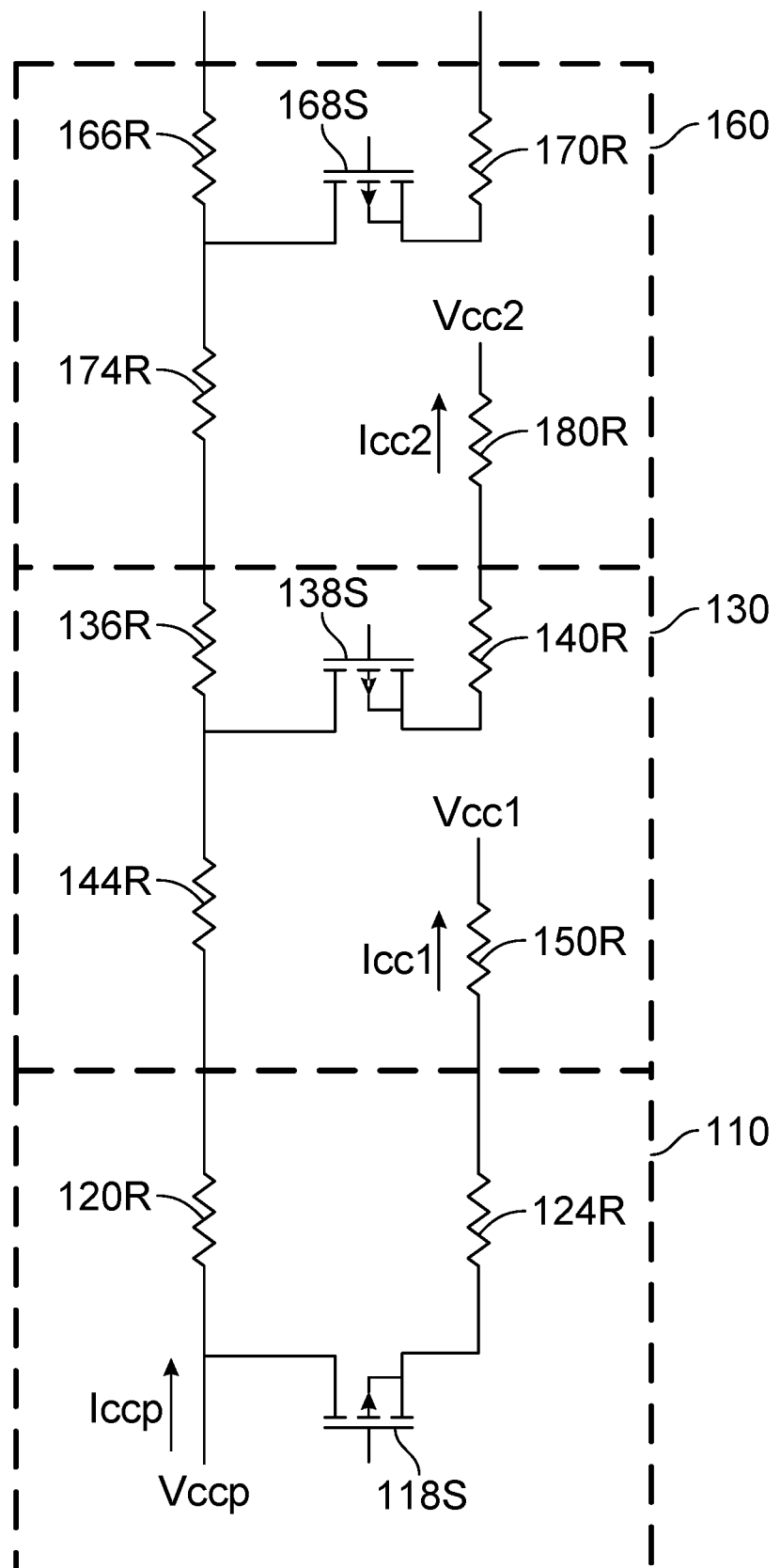
FIG. 4 is a simplified circuit schematic for power distribution and power gating in the 3D die stack of FIG. 3, in accordance with some examples of the present disclosure.

FIG. 4 illustrates a simplified circuit schematic for power distribution and power gating in the 3D die stack of FIG. 3, in accordance with some examples of the present disclosure. A power voltage Vccp is provided by the power management region 116 of the first die 110. A stack resistance 120R and a power gating switch 118S are connected to the power voltage Vccp. The stack resistance 120R is the resistance of the metal line and via stack 120 of the first die 110 from the metal line 122 to the bonding interface with the second die 130. The power gating switch 118S illustrates one or more switches or devices (e.g., one or more power FETs) in the power gating region 118 that are capable of interrupting a power flow. The power gating switch 118S is then connected to a routing resistance 124R, which represents the resistance of the routing 124 in the first die 110. The routing resistance 124R is then connected to a routing resistance 150R, which further provides a first device power voltage Vcc1 in the second die 130. The routing resistance 150R represents the resistance of the routing 150 in the second die 130. Although a resistance may be created by the metal line 122 in the first die 110 of FIG. 3, such resistance is assumed to be negligible (e.g., due to close proximity of interconnected components) and/or incorporated into other resistances in the illustration of FIG. 4.

The stack resistance 120R is then connected to a stack resistance 144R, which is the resistance of metal line and via stack 144 of the second die 130 from the bonding interface with the first die 110 to the metal line 146. A TSV resistance 136R and a power gating switch 138S are connected to the stack resistance 144R. The TSV resistance 136R is the resistance of TSVs in the TSV region 136 of the second die 130 and any portion of the metal line and via stack 144 of the second die 130 between the semiconductor substrate 132 and the metal line 146. The power gating switch 138S illustrates one or more switches or devices (e.g., one or more power FETs) in the power gating region 138 that are capable of interrupting a power flow. The power gating switch 138S is then connected to a TSV resistance 140R, which represents the resistance of TSVs in the TSV region 140 in the second die 130. The TSV resistance 140R is then connected to a routing resistance 180R, which further provides a second device power voltage Vcc2 in the third die 160. The routing resistance 180R represents the resistance of the routing 180 in the third die 160. Although a resistance may be created by the metal lines 146 and 148 in the second die 130 of FIG. 3, such resistance is assumed to be negligible and/or incorporated into other resistances in the illustration of FIG. 4.

The TSV resistance 136R is then connected to a stack resistance 174R, which is the resistance of metal line and via stack 174 of the third die 160 from the bonding interface with the second die 130 to the metal line 176. A TSV resistance 166R and a power gating switch 168S are connected to the stack resistance 174R. The TSV resistance 166R is the resistance of TSVs in the TSV region 166 of the third die 160 and any portion of the metal line and via stack 174 of the third die 160 between the semiconductor substrate 162 and the metal line 176. The power gating switch 168S illustrates one or more switches (e.g., one or more power FETs) in the power gating region 168 that are capable of interrupting a power flow. The power gating switch 168S is then connected to a TSV resistance 170R, which represents the resistance of TSVs in the TSV region 170 in the third die 160. Although a resistance may be created by the metal lines 176 and 178 in the third die 160 of FIG. 3, such resistance is assumed to be negligible and/or incorporated into other resistances in the illustration of FIG. 4.

Additional dies can be included in the 3D die stack, as stated previously. If one or more additional dies are included in the 3D die stack, and if the die(s) has a same configuration as the second die 130 and/or third die 160, the circuit schematic of those dies can be replicated and appended to the 3D die stack similar to the pattern illustrated by the second die 130 and third die 160 in FIG. 4.

The power voltage Vccp is provided by the power management region 116 of the first die 110. The first device power voltage Vcc1 is the voltage provided at the circuit region 142 of the second die 130 for operating devices therein. Further, a first device current Icc1 is provided to the circuit region 142 of the second die 130. The second device power voltage Vcc2 is the voltage provided at the circuit region 172 of the third die 160 for operating devices therein. Also, a second device current Icc2 is provided to the circuit region 172 of the third die 160. For voltage analysis purposes, assume that the first device current Icc1 and the second device current Icc2 are substantially equal, which results in the power current Iccp being substantially two times the first device current Icc1 (or second device current Icc2). Further, assume that resistances in the second die 130 are substantially equal to corresponding resistances in the third die 160 (e.g., the TSV resistances 136R and 166R are substantially equal, the stack resistances 144R and 174R are substantially equal, the routing resistances 150R and 180R are substantially equal, etc.), and that voltage drops across the power gating switches 118S and 138S are substantially equal.

Under the described circumstances, the voltage drop from the power voltage Vccp to the first device power voltage Vcc1 is the voltage drop across the power gating switch 118S plus the first device current Icc1 times the sum of the routing resistances 124R and 150R. E.g., $V_{ccp}-V_{cc1}=V_{118S}+I_{cc1}*(R_{124}+R_{150})$. Under the described circumstances, the voltage drop from the power voltage Vccp to the second device power voltage Vcc2 is the voltage drop across the power gating switch 138S plus the second device current Icc2 times the sum of the stack resistances 120R and 144R, TSV resistance 140R, and routing resistance 180R. E.g., $V_{ccp}-V_{cc2}=V_{138S}+I_{cc2}*(R_{120}+R_{144}+R_{140}+R_{180})=V_{118S}+I_{cc1}*(R_{120}+R_{144}+R_{140}+R_{150}]$.

In the illustrated example, the current flowing to a circuit region on a die flows from a power gating region on another, different die. The current enters the die through routing that generally extends vertically once (e.g., without extending from a lower metallization to an upper metallization back to a lower metallization) in the die that includes the circuit region to which the current flows. This can permit more room for routing for other signals in the die, such as in metallization layers directly aligned with the respective power gating region in the die. The power gating region can be connected to the routing on the die of the circuit region through routing and/or TSVs of the die that includes the power gating region. In such examples, current flowing through a power gating region to a circuit region may be more direct, and hence, may flow through fewer metal components. This can generally reduce resistance of the current path, which can reduce a voltage drop. Additionally, a TSV region may be reduced in size because fewer TSVs may be implemented to accommodate a desired voltage drop. Even further, the power gating region is decoupled, at least in part, from the processes that that form the circuit region to which the power gating region provides power distribution and control. The decoupling is due to the power gating region being formed on a different die from the circuit region. This decoupling can help ensure that power is interrupted by the power gating region when the circuit region is faulty or on a bad die.

In the examples illustrated in FIGS. 1 through 4, the first die 10 and 110 is illustrated and described as being in a face-up orientation. In other examples, the first die can be in a face-down orientation, and the components of the first die can be electrically connected through TSVs on the first die to components on the second die. A person having ordinary skill in the art will readily understand the various modifications that may be made to implement such structures.

Additionally, although not illustrated in the figures, the 3D die stacks can have external electrical connectors (e.g., microbumps, controlled collapse chip connection (C4) bumps, etc.) for connecting the 3D die stacks to another substrate (e.g., an interposer, a package substrate, or the like). The external electrical connectors can be attached to a die (e.g., first die 10 or 110) opposite from a bonding interface between the die and an overlying die (e.g., second die 30 or 130). Accordingly, in the configurations of FIGS. 1 and 3, the first dies 10 and 110 can further include TSVs extending through the semiconductor substrates 12 and 112, and the external electrical connectors can be electrically connected to the TSVs for providing input/output signals and power through the TSVs to the metallization layers 14 and 114 and then to various circuit regions on semiconductor substrates 12 and 112. In other examples where the first die is in a face-down orientation, the external electrical connectors can be electrically connected to routing in the metallization layers 14 and 114 for providing input/output signals and power through the metallization layers 14 and 114 to various circuit regions on semiconductor substrates 12 and 112. In such examples with a face-down first die, the first dies can include TSVs which are electrically connected to the second dies for providing power distribution and/or control to overlying dies.

Figure 5:
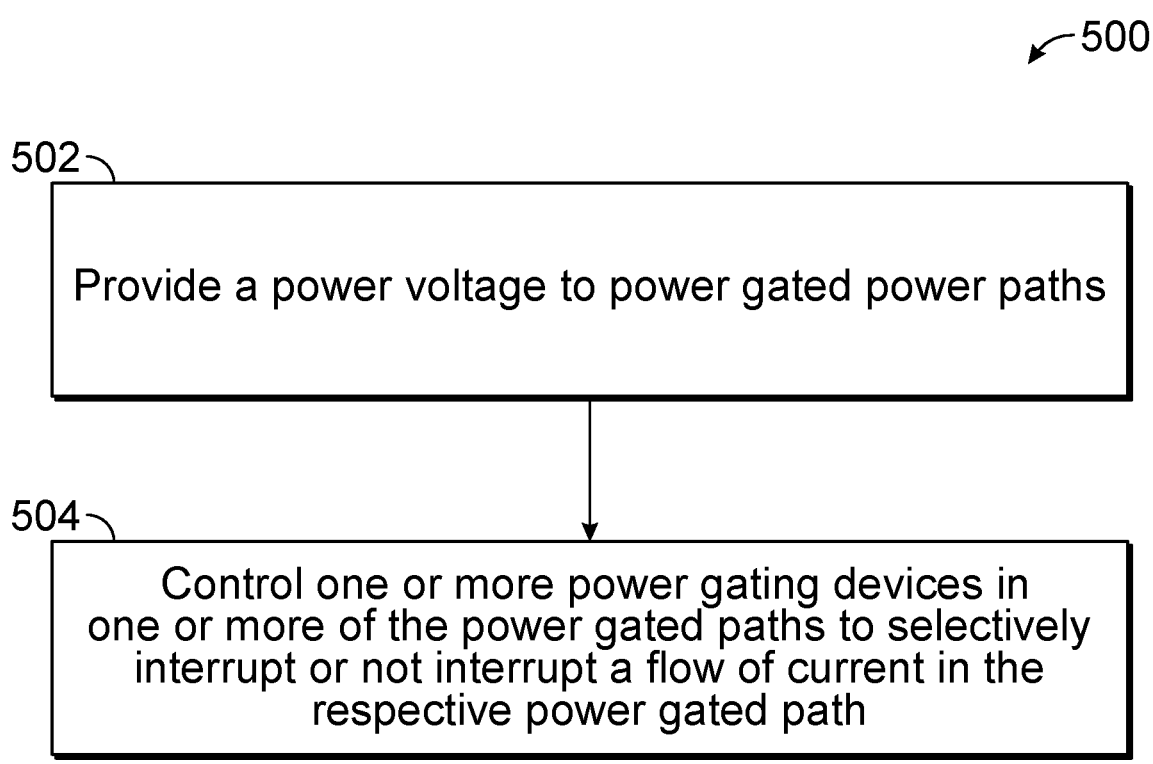
FIG. 5 is a flow chart of a method for operating a 3D die stack, in accordance with some examples of the present disclosure.

FIG. 5 is a flow chart of a method 500 for operating a 3D die stack, in accordance with some examples of the present disclosure. In operation 502, a power voltage is provided to power gated power paths in the 3D die stack. For example, the power management region 16 and 116 can provide the power voltage Vccp to the power gated power paths as described above. In operation 504, one or more power gating devices in one or more of the power gated paths are controlled to selectively interrupt or not interrupt a flow of current in the respective power gated path. For example, each die that has a power gating device (and/or that includes the circuit that is power gated) further includes hardware logic, a processor executing program code instructions, or the like that is capable of detecting a condition of the circuit implemented by the circuit region connected to the power gated path in which the power gating device is connected. For example, the hardware logic, processor, or the like can detect when the circuit is faulty, is to enter a shut-down or sleep mode, or the like. The hardware logic, processor, or the like can control the power gating device to open under appropriate conditions (e.g., to prevent leakage through the circuit) or to close under normal operations, for example.

As used herein (including the claims that follow), a phrase referring to "at least one of" a list of items refers to any combination of those items, including single members. As an example, "at least one of: x, y, and z" is intended to cover: x, y, z, x-y, x-z, y-z, x-y-z, and any combination thereof (e.g., x-y-y and x-x-y-z).

While the foregoing is directed to examples of the present disclosure, other and further examples of the disclosure may be devised without departing from the basic scope thereof, and the scope thereof is determined by the claims that follow.

What is claimed is:

1. An apparatus comprising:
 a stacked die structure comprising:
  a first die comprising a first semiconductor substrate, the first semiconductor substrate comprising a first power gating region;
  a second die bonded to the first die, the second die comprising a second semiconductor substrate, the second semiconductor substrate comprising a first circuit region and a second power gating region; and
  a third die bonded to the second die, the third die comprising a third semiconductor substrate, the third semiconductor substrate comprising a second circuit region; and wherein:
 the stacked die structure includes a first power gated power path configured to provide power to the first circuit region;
 the first power gated power path comprises a first power gating device that is in the first power gating region of the first semiconductor substrate and is configured to interrupt a flow of current through the first power gated power path;
 the stacked die structure includes a second power gated power path configured to provide power to the second circuit region; and
 the second power gated power path comprises a second power gating device that is in the second power gating region of the second semiconductor substrate and is configured to interrupt a flow of current through the second power gated power path.

2. The apparatus of claim 1, wherein:
 the second die further comprises first metallization layers on the second semiconductor substrate;
 the first power gated power path includes first routing in the first metallization layers to the first circuit region; and
 the second power gated power path includes a first metal stack in the first metallization layers and first through-substrate vias (TSVs) through the second semiconductor substrate, the first metal stack being separate from the first routing.

3. The apparatus of claim 2, wherein:
 the third die further comprises second metallization layers on the third semiconductor substrate; and
 the second power gated power path further includes second routing in the second metallization layers to the second circuit region.

4. The apparatus of claim 2, wherein:
 the third die further comprises second metallization layers on the third semiconductor substrate;
 the stacked die structure includes a first non-power gated power path configured to provide power to a third circuit region on the second semiconductor substrate;
 the first non-power gated power path includes at least a portion of the first metal stack;
 the stacked die structure includes a second non-power gated power path configured to provide power to a fourth circuit region on the third semiconductor substrate; and
 the second non-power gated power path includes the first metal stack, second TSVs through the second semiconductor substrate, and at least a portion of a second metal stack in the second metallization layers.

5. The apparatus of claim 1, wherein:
 the second die further comprises first metallization layers on the second semiconductor substrate; and
 the first power gated power path includes first routing in the first metallization layers, the first routing being from a first bonding interface between the first die and the second die to the first circuit region.

6. The apparatus of claim 5, wherein:
 the third die comprises second metallization layers on the third semiconductor substrate; and
 the second power gated power path further includes second routing in the second metallization layers, the second routing being from a second bonding interface between the second die and the third die to the second circuit region.

7. The apparatus of claim 1, wherein:
the second die further comprises:
- first metallization layers on the second semiconductor substrate;
- first through substrate vias (TSVs) through the second semiconductor substrate;
- second TSVs through the second semiconductor substrate;
- a first metal stack in the first metallization layers and extending from a first bonding interface between the first die and the second die to the first TSVs; and
- first routing in the first metallization layers and extending from the first bonding interface to the first circuit region, the first routing being separate from the first metal stack, the first power gated power path comprising the first routing;

the second power gating device is electrically connected between the first metal stack and the second TSVs; and
the third die further comprises:
- second metallization layers on the third semiconductor substrate;
- third TSVs through the third semiconductor substrate;
- a second metal stack in the second metallization layers and extending from a second bonding interface between the second die and the third die to the third TSVs, the second metal stack being connected to the first TSVs; and
- second routing in the second metallization layers and extending from the second bonding interface to the second circuit region, the second routing being separate from the second metal stack.

8. An apparatus comprising:
a stacked die structure comprising:
- a first die; and
- a second die bonded to the first die, the first die being configured to provide power to the second die at a first bonding interface between the first die and the second die, the second die comprising:
  - a first semiconductor substrate comprising a first circuit region and a first power gating region;
  - first metallization layers on the first semiconductor substrate, the first metallization layers including a metal stack; and
  - first through-substrate vias (TSVs) through the first semiconductor substrate, the metal stack being connected to the first TSVs, wherein a first power gated power path is from the first bonding interface through the first TSVs, a first power gating device of the first power gating region, and first routing of the first metallization layers to the first circuit region; and
- a third die bonded to the second die, the third die comprising:
  - a second semiconductor substrate comprising a second circuit region and a second power gating region;
  - second metallization layers on the second semiconductor substrate; and
  - second TSVs through the second semiconductor substrate, wherein a second power gated power path is from the first bonding interface through the first TSVs, the metal stack, the second TSVS, a second power gating device of the second power gating region, and second routing of the second metallization layers to the second circuit region.

9. The apparatus of claim 8, wherein:
a first bonding side of the second die corresponds to a side having the first metallization layers;
a second bonding side of the third die corresponds to a side having the second semiconductor substrate; and
the first bonding side is bonded to the second bonding side at a second bonding interface between the second die and the third die.

10. The apparatus of claim 8, wherein:
the first die comprises a third semiconductor substrate and third metallization layers on the third semiconductor substrate;
a first bonding side of the first die corresponds to a side having the third metallization layers;
a second bonding side of the second die corresponds to a side having the first semiconductor substrate; and
the first bonding side is bonded to the second bonding side at the first bonding interface.

11. The apparatus of claim 8, wherein:
the first power gated power path includes a metal line connected between the metal stack and the first power gating device of the first power gating region; and
the metal line is in a metallization layer of the first metallization layers that is within six metallization layers of the first semiconductor substrate.

12. The apparatus of claim 8, wherein:
the first power gated power path is not through a metal line or via of the metal stack that is in a metallization layer of the first metallization layers that is most distal from the first semiconductor substrate.

13. The apparatus of claim 8, wherein:
a non-power gated power path is from the first bonding interface through the first TSVs, the metal stack, and second routing of the first metallization layers to a third circuit region in the first semiconductor substrate.

* * * * *

UNITED STATES PATENT AND TRADEMARK OFFICE
CERTIFICATE OF CORRECTION

PATENT NO.         : 10,826,492 B2
APPLICATION NO.    : 16/118899
DATED              : November 3, 2020
INVENTOR(S)        : Prashant Dubey et al.

Page 1 of 1

It is certified that error appears in the above-identified patent and that said Letters Patent is hereby corrected as shown below:

In the Claims

Column 20, Line 11, In Claim 8, delete "TSVS," and insert -- TSVs, --, therefor.

Signed and Sealed this
Fifteenth Day of June, 2021

Drew Hirshfeld
*Performing the Functions and Duties of the*
*Under Secretary of Commerce for Intellectual Property and*
*Director of the United States Patent and Trademark Office*